United States Patent
Coss, Jr. et al.

(10) Patent No.: US 6,905,895 B1
(45) Date of Patent: Jun. 14, 2005

(54) PREDICTING PROCESS EXCURSIONS BASED UPON TOOL STATE VARIABLES

(75) Inventors: Elfido Coss, Jr., Austin, TX (US); Mark K. Sze-To, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 403 days.

(21) Appl. No.: 10/185,495

(22) Filed: Jun. 28, 2002

(51) Int. Cl.[7] .......................... G01R 31/26; H01L 21/00; G06F 19/00

(52) U.S. Cl. ......................... 438/16; 438/7; 700/121; 700/108

(58) Field of Search .................... 438/16, 14, 7, 438/5; 700/121, 108

(56) References Cited

PUBLICATIONS

International Sematech "Advanced Process Control Framework Initiative (APCFI) Project Overview" Tech Transfer #99053735A–TR also at <<http://www.sematech.org/docubase/document/3735atr.pdf>> Jun. 30, 1999.*

* cited by examiner

*Primary Examiner*—Craig A. Thompson
(74) *Attorney, Agent, or Firm*—Williams, Morgan & Amerson, P.C.

(57) ABSTRACT

A method and an apparatus for predicting excursions based upon tool state variables. At least one semiconductor wafer is processed in a processing tool. Tool state data relating to the processing tool is acquired. The tool state data comprises at least one tool state variable. A determination is made whether an excursion of the tool health related to the processing tool has occurred based upon the tool state data. The tool state variable is modified to reduce the excursion of the tool health in response to the determination that the excursion of the tool health has occurred.

38 Claims, 8 Drawing Sheets

PREDICTING PROCESS EXCURSIONS BASED UPON TOOL STATE VARIABLES

BACKGROUND OF THE INVENTION

1. Field of the Invention

This invention relates generally to semiconductor manufacturing, and, more particularly, to a method and apparatus for predicting process excursions based upon analysis of tool state variables.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer composed of a variety of materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used for a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure. Typically, forming trenches across the semiconductor wafer and filling such trenches with an insulating material, such as silicon dioxide, form STI structures across the semiconductor wafers.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

Figure 1:
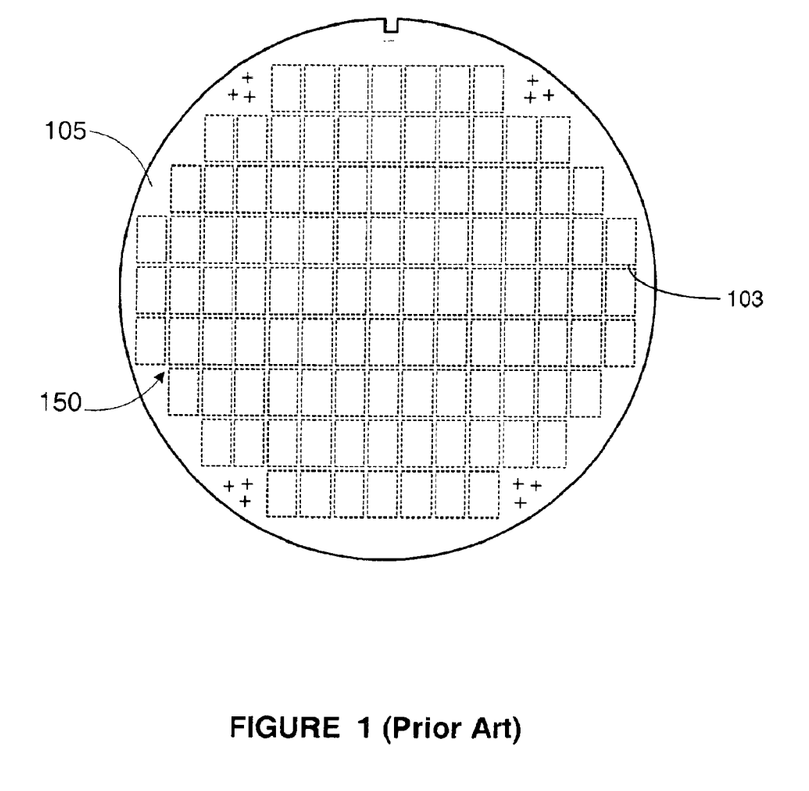
FIG. 1 is a simplified diagram of a prior art semiconductor wafer being processed.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 at several locations at a time, depending on the specific photomask employed. The patterned photoresist layer can be used as a mask during etching processes, wet or dry, performed across the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

The health of a processing tool (tool health) may vary during wafer-processing performed by the processing tool. The tool health may relate to an assessment of how well the processing tool operates within a predetermined specification, which may include specifications such as tool environment characteristics (e.g., tool temperature, humidity, and the like) and quality and accuracy of the process performed by the processing tool. Excursions in the tool health may occur and adversely affect the quality of processed semiconductor wafers 105. Furthermore, a tool model that controls and monitors the operations performed by the processing tool may not detect some excursions in the tool health, which may cause a variation in the semiconductor wafers processed by the processing tool.

Figure 2:
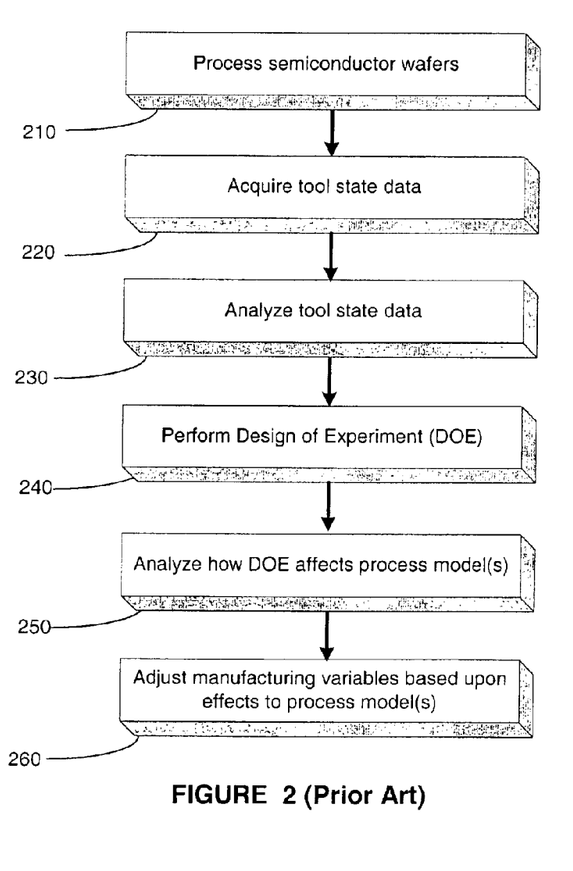
FIG. 2 illustrates a simplified flowchart depiction of a prior art process flow during manufacturing of semiconductor wafers.

Turning now to FIG. 2, a flow chart depiction of a prior art process flow that includes monitoring the tool health of a processing tool is illustrated. A manufacturing system processes one or more semiconductor wafers 105 (block 210). The manufacturing system may then acquire tool state data relating to the processing tool during the processing of semiconductor wafers 105 (block 220). The tool state data may include the pressure, the humidity, the temperature, the gas flow rate, etc., relating to the processing chamber associated with a processing tool. Upon analysis of the tool state data, a design-of-experiment may be performed to analyze the tool health (block 230).

The design-of-experiment may include performing an experiment related to a particular tool state variable, such as the pressure in a process chamber, and modifying the tool state variable (e.g., pressure) to examine how such modification affects the overall tool health (block 240). The design-of-experiment may be used to analyze the changes brought about by the design-of-experiment and how it affects a model, such as a tool model, used to model, control, and/or monitor the operation of a processing tool (block 250). Upon examination of the effect(s) of the design-of-experiment on a processing tool model, the manufacturing system may adjust one or more manufacturing variables (e.g., pressure, temperature, humidity, gas flow rate, etc.) to compensate or adjust the operation of the processing tool to perform manufacturing processes in a more accurate and efficient fashion (block 260).

Among the problems associated with the current methodology include the fact that the design-of-experiment utilizes a large amount of resources within a manufacturing environment. Performing a design-of-experiment to analyze the affect on a tool health model requires a large amount of planning, and requires the use of a great deal of processing tool time. Furthermore, designing certain experiments, such as experimentation with zone temperatures and other faults, are difficult to simulate and/or study. Additionally, a lack of knowledge of the processing tool health and the effects of certain manufacturing variables on a processing tool model may cause a processing tool to drift. This drift may cause a variance or degradation in the overall quality and efficiency of wafers processing.

The present invention is directed to overcoming, or at least reducing, the effects of, one or more of the problems set forth above.

SUMMARY OF THE INVENTION

In one aspect of the present invention, a method is provided for predicting excursions based upon tool state variables. At least one workpiece is processed in a processing tool. Tool state data relating to the processing tool is acquired. The tool state data comprises at least one tool state variable. A determination is made whether an excursion of the tool health related to the processing tool has occurred based upon the tool state data. The tool state variable is modified to reduce the excursion of the tool health in response to the determination that the excursion of the tool health has occurred.

In another aspect of the present invention, a system is provided for predicting excursions based upon tool state variables. The system of the present invention includes a processing tool to process a workpiece. The system also includes a process controller operatively coupled to the processing tool. The process controller is adapted to acquire tool state data relating to the processing tool, determine whether an excursion of the tool health related to the processing tool has occurred based upon the tool state data, modify the tool state variable to reduce the excursion of the tool health in response to the determination that the excursion of the tool health has occurred.

In another aspect of the present invention, an apparatus is provided for predicting excursions based upon tool state variables. The apparatus of the present invention includes a process controller adapted to acquire tool state data relating to a processing tool. The apparatus is further adapted to determine whether an excursion of the tool health related to the processing tool has occurred based upon the tool state data, modify the tool state variable to reduce the excursion of the tool health in response to the determination that the excursion of the tool health has occurred.

In yet another aspect of the present invention, a computer readable program storage device encoded with instructions is provided for predicting excursions based upon tool state variables. The computer readable program storage device encoded with instructions when executed by a computer processes a workpiece in a processing tool; acquires tool state data relating to the processing tool, the tool state data comprising a tool state variable; determines whether an excursion of the tool health related to the processing tool has occurred based upon the tool state data; and modifies the tool state variable to reduce the excursion of the tool health in response to the determination that the excursion of the tool health has occurred.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. In may different instances, semiconductor devices are conveyed through a plurality of manufacturing process tools. Embodiments of the present invention provide for manipulating one or more manufacturing variables by modifying one or more processing tool variables and analyzing the results from the modification of the processing tool variable in a processing tool model, which may be a model that is used to control and monitor the operation of a processing tool. Embodiments of the present invention provide for analyzing data relating to excursions from normal processing tool operations relating to a plurality of processing runs performed by a processing tool and manipulating the data to analyze the affect of the manipulation on a processing tool model.

Many times, excursions in the tool health of a processing tool may be excessive enough to produce variations in the processed workpieces (e.g., semiconductor wafers 105, semiconductor devices, and the like)>but may go undetected. Embodiments of the present invention provide for acquiring stored data that may have caused particular excursions in the tool health, adjusting various elements of a tool model, such as tool state variables, and performing operations using the processing tool to analyze the affect on the tool model. Therefore, using embodiments of the present invention, a behavior of a tool model can be adjusted such that the tool model becomes more sensitive to particular excursions that may not have been flagged prior to implementing embodiments of the present invention. Embodiments of the present invention may be used to validate a tool model to insure improved operation of a processing tool. Embodiments of the present invention may also be used to flag excursions in the tool health that may not have been flagged without the proper manipulation of certain elements of the tool model.

Figure 3:
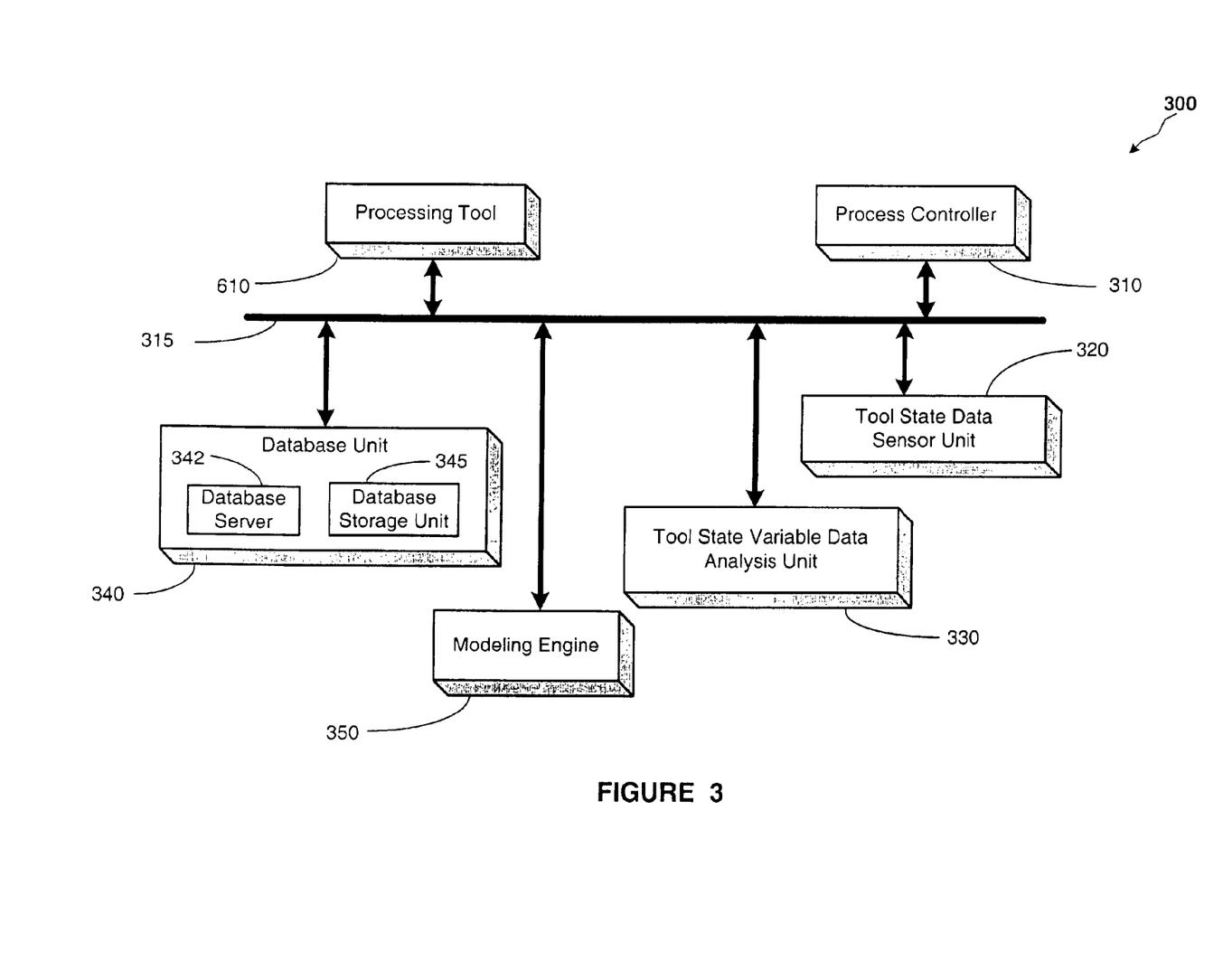
FIG. 3 provides a block diagram representation of a system in accordance with one illustrative embodiment of the present invention.

Turning now to FIG. 3, a block diagram depiction of a system 300 in accordance with an embodiment of the present invention is illustrated. The system 300 comprises a processing tool 610 that is capable of processing a plurality of semiconductor wafers 105. A process controller 310 generally controls the operations of the processing tool 610. The system 300 also comprises a tool state data sensor unit 320 which may comprise a plurality of sensors capable of detecting a plurality of manufacturing variables. The tool state data sensor unit 320 may comprise active sensors (e.g., sensors that comprise active components to detect a value of a tool state variable, such as sensors that measure a gas flow rate) and/or passive sensors (e.g., sensors that comprise passive components to measure a value of a tool state variable, such as passive electrical components that measure a DC bias voltage).

Figure 4:
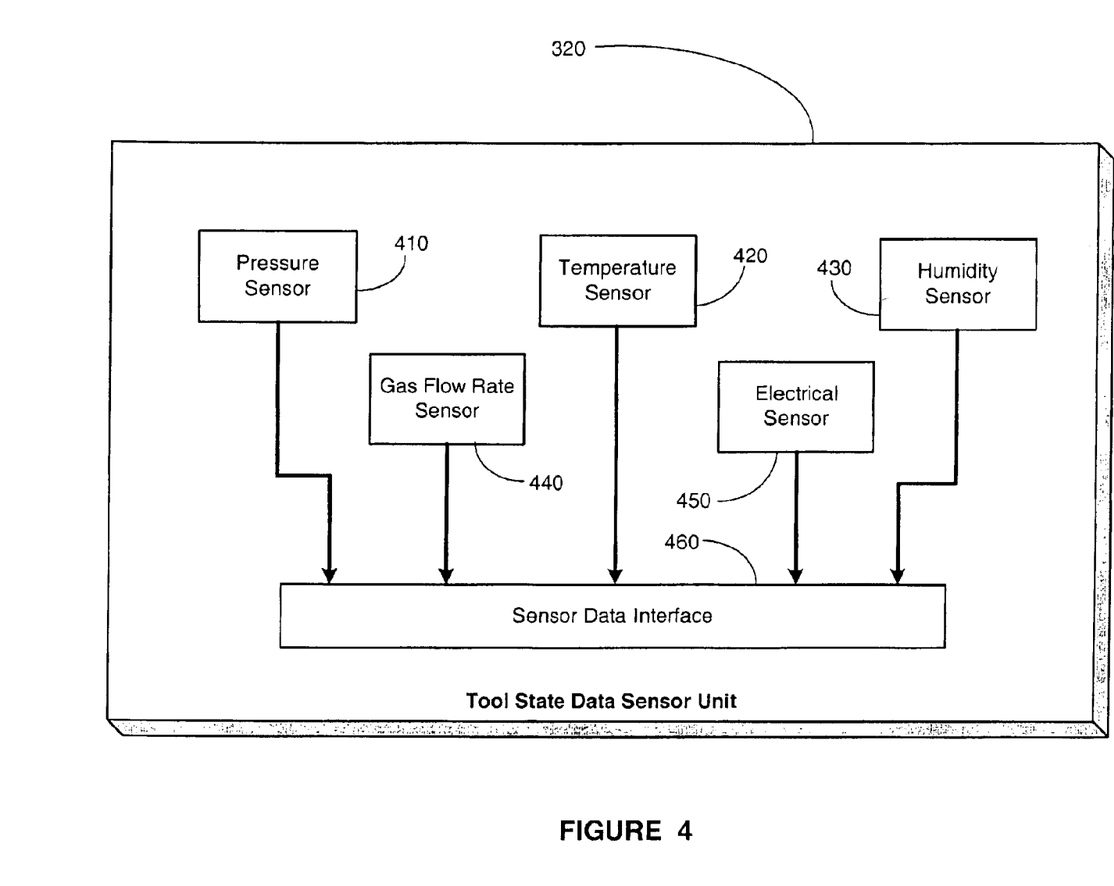
FIG. 4 illustrates a more detailed block diagram representation of a tool state data sensor unit of FIG. 3, in accordance with one illustrative embodiment of the present invention.

As illustrated in FIG. 4, the tool state data sensor unit 320 may comprise a pressure sensor 410, a temperature sensor 420, a humidity sensor 430, a gas flow rate sensor 440, and a current sensor 450. The pressure sensor 410 is capable of detecting the pressure within a chamber in the processing tool 610. The temperature sensor 420 is capable of sensing the temperature of various portions of the processing tool 610. The humidity sensor 430 is capable of detecting the relative humidity at various portions of the processing tool 610. The gas flow rate sensor 440 may comprise a plurality of flow-sensors that are capable of detecting the flow-rate of a plurality of process gases utilized during processing of semiconductor wafers 105. For example, the gas flow rate sensor 440 may comprise sensors that can detect the flow rate of gases such as $NH_3$, $SiH_4$, $N_2$, $N_2O$, and other process gases.

The tool state sensor unit 320 may also comprise an electrical sensor 450 that is capable of detecting a plurality of electrical parameters, including a current provided to a lamp used in a photolithography process. The tool state sensor unit 320 may also comprise other sensors capable of detecting a variety of manufacturing variables known to those skilled in the art having benefit of the present disclosure. The tool state data sensor unit 320 may also comprise a sensor data interface 460. The sensor data interface 460 may receive sensor data from the various sensors contained within the tool state data sensor unit 320 and transmit the data to the process controller 310.

Turning back to FIG. 3, a database unit 340 may store tool state data relating to a plurality of process runs performed by the processing tool 610. The database unit 340 may comprise a database server 342 for storing tool state data and/or other manufacturing data related to processing semiconductor wafers 105, into a database storage unit 345. A tool state variable data analysis unit 330 is capable of analyzing the data from the tool state data sensor unit 320 and/or data from the database unit 340. A more detailed description of the tool state variable data analysis unit 330 is provided in FIG. 5 and accompanying description below.

The system 300 also comprises a modeling engine 350 capable of modeling the operation of one or more tools, such as the processing tool 610. The modeling engine 350 may comprise one or more tool models that may operate, examine, and/or control the operations of the processing tool 610. Modifications to various tool models may be performed by the modeling engine 350 in response to analysis data from the tool state variable data analysis unit 330, thereby reducing the possibility of excessively large excursions by the processing tool 610.

In one embodiment, the tool state data analysis unit 330 and/or the modeling engine 350 may be a software, firmware, or hardware unit, which may be standalone units or may be integrated into a computer system associated with the process controller 310. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Figure 5:
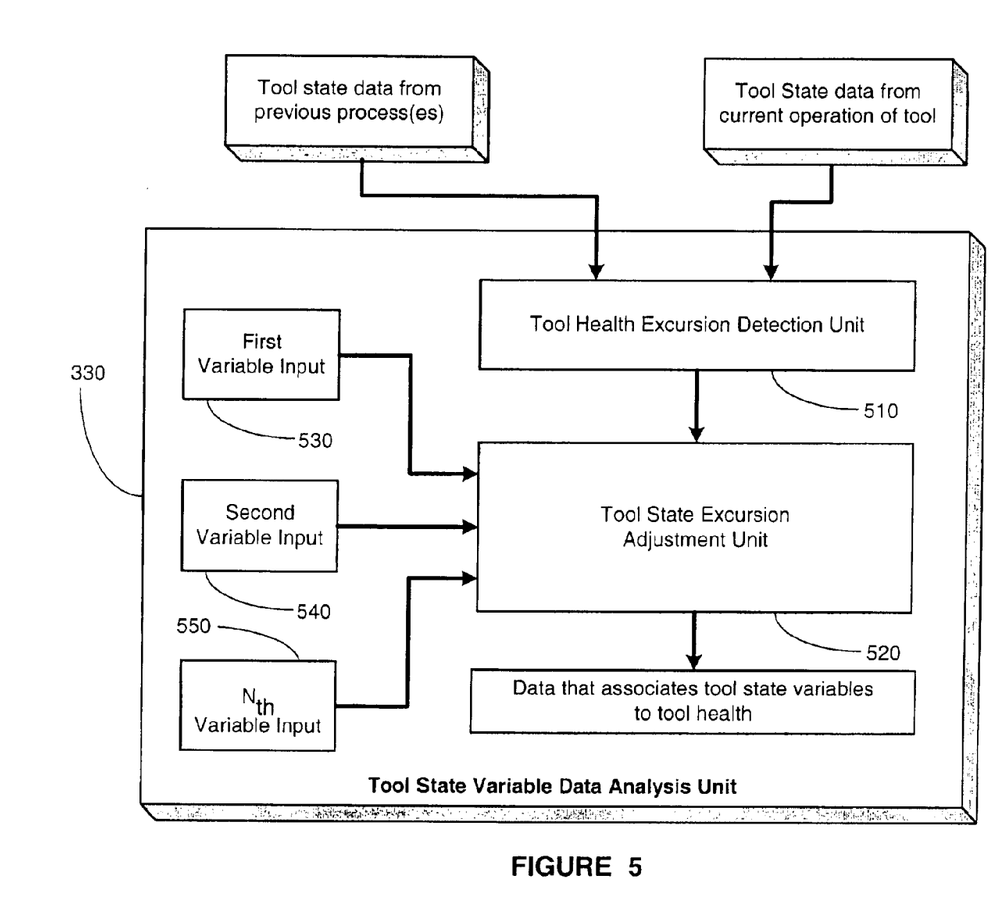
FIG. 5 illustrates a more detailed block diagram representation of a tool state variable data analysis unit of FIG. 3, in accordance with one illustrative embodiment of the present invention.

Turning now to FIG. 5, a more detailed description of a block diagram depiction of the tool state variable data analysis unit 330 is illustrated. The tool state variable data analysis unit 330 may receive tool state data from a previous process and/or tool state data from a current operation performed by the processing tool 610. Tool state data from the previous process is generally retrieved from the database unit 340. Tool state data relating to a current operation performed by the processing tool 610 may be received from the processing tool 610 in an inline fashion. The tool state variable data analysis unit 330 may comprise a tool health excursion detection unit 510 for detecting excursion of the tool health of the processing tool 610. The tool state variable data analysis unit 330 may also comprise a tool state excursion adjustment unit 520 for adjusting one or more operation parameters relating to the processing tool 610 to reduce possible excursions of the tool health.

The tool health excursion detection unit 510 is capable of detecting excursions of the tool health based upon tool state data from previous processes and/or from current operation of the processing tool 610. Based upon detecting a possible excursion of the tool health, the system 300 may perform adjustments to the tool state variables of a processing tool 610 to reduce tool health excursions. The tool state excursion adjustment unit 520 is capable of performing adjustments to affect the tool state variables and/or the excursions experienced by the processing tool 610. The tool state excursion adjustment unit 520 may receive data via a first variable input 530, and/or via a second variable input 540 through an $N^{th}$ variable input 550. The first through $N^{th}$ variable inputs 530–550 may comprise data interfaces (not shown) that receive certain tool state variables that can affect the operation of the processing tool 610. The values of the data received by the variable inputs 530, 540, 550 may be determined by an operator who may monitor and change particular tool state variables to affect the excursion(s) experienced by the processing tool 610.

The tool state excursion adjustment unit 520 is capable of generating data that relates certain tool state variables to tool health. For example, the first variable input 530 may relate to the pressure in the process chamber in the processing tool 610. The tools state variable that represents the pressure in the process chamber may be adjusted using the first variable input 530 to affect the excursion experienced by the processing tool 610. Data that relates the tool state variables to the tool health is then sent to the modeling engine 350. The modeling engine 350 may the perform adjustment(s) to tool models to affect the operation of the processing tool 610 to reduce the possibility of tool health excursions.

Figure 6:
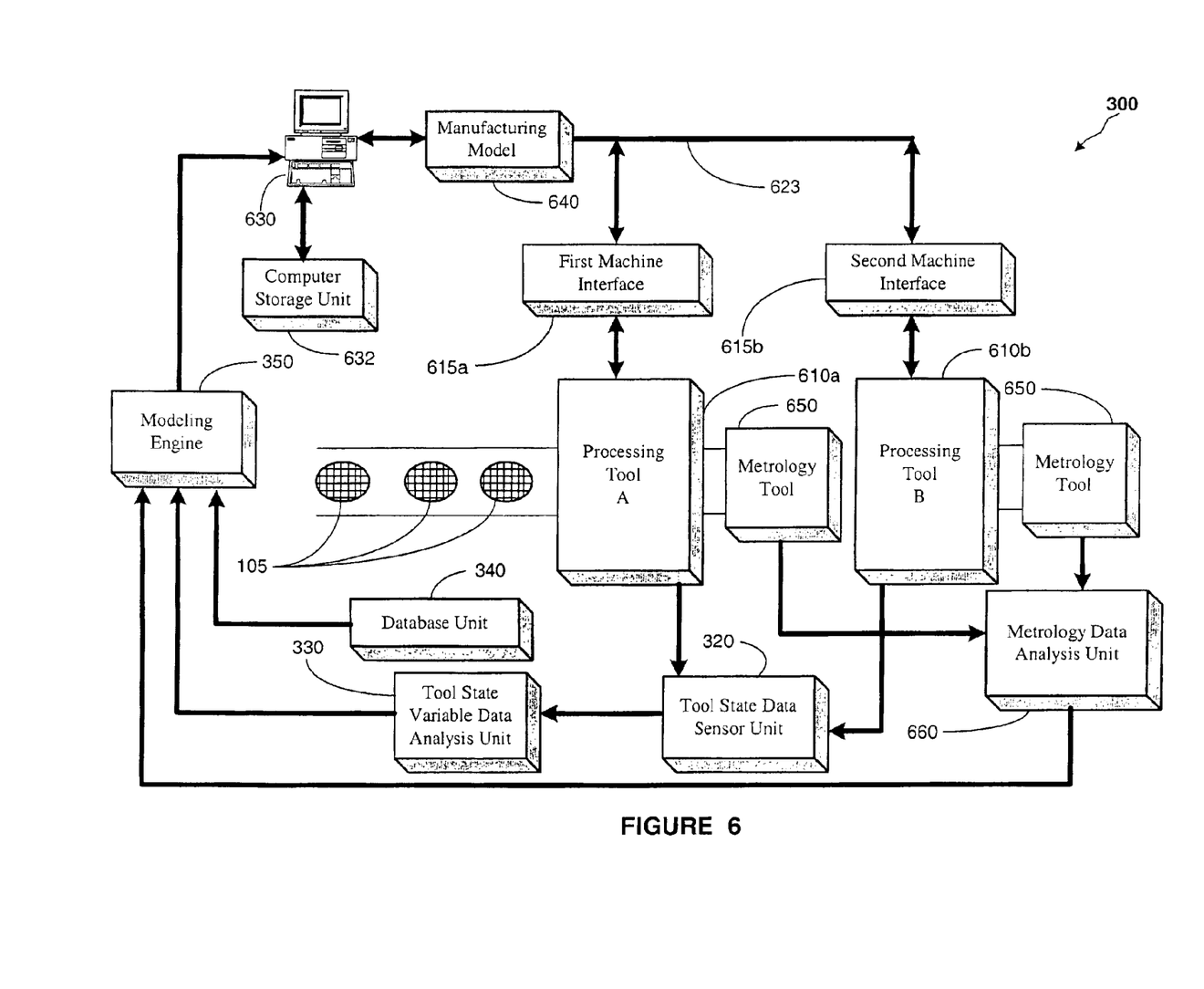
FIG. 6 illustrates a more detailed block diagram representation of the system shown in FIG. 3, in accordance with one illustrative embodiment of the present invention.

Turning now to FIG. 6, a more detailed block diagram of the system 300 in accordance with one embodiment of the present invention is illustrated. Semiconductor wafers 105 are processed on processing tools 610a, 610b using a plurality of control input signals, or manufacturing parameters, provided via a line or network 623. The control input signals, or manufacturing parameters, on the line 623 are sent to the processing tools 610a, 610b from a computer system 630 via machine interfaces 615a, 615b. The first and second machine interfaces 615a, 615b are generally located outside the processing tools 610a, 610b. In an alternative embodiment, the first and second machine interfaces 615a, 615b are located within the processing tools 610a, 610b. The semiconductor wafers 105 are provided to and carried from a plurality of processing tools 610. In one embodiment, semiconductor wafers 105 may be provided to a processing tool 610 manually. In an alternative embodiment, semiconductor wafers 105 may be provided to a processing tool 610 in an automatic fashion (e.g., robotic movement of semiconductor wafers 105). In one embodiment, a plurality of semiconductor wafers 105 is transported in lots (e.g., stacked in cassettes) to the processing tools 610.

In one embodiment, the computer system 630 sends control input signals, or manufacturing parameters, on the line 623 to the first and second machine interfaces 615a, 615b. The computer system 630 is capable of controlling processing operations. In one embodiment, the computer system 630 is a process controller. The computer system 630 is coupled to a computer storage unit 632 that may contain a plurality of software programs and data sets. The computer system 630 may contain one or more processors (not shown) that are capable of performing the operations described herein. The computer system 630 employs a manufacturing model 640 to generate control input signals on the line 623. In one embodiment, the manufacturing model 640 contains a manufacturing recipe that determines a plurality of control input parameters that are sent on the line 623 to the processing tools 610a, 610b.

In one embodiment, the manufacturing model 640 defines a process script and input control that implement a particular manufacturing process. The control input signals (or control input parameters) on the line 623 that are intended for processing tool A 610a are received and processed by the first machine interface 615a. The control input signals on the line 623 that are intended for processing tool B 610b are received and processed by the second machine interface 615b. Examples of the processing tools 610a, 610b used in semiconductor manufacturing processes are steppers, etch process tools, deposition tools, and the like.

One or more of the semiconductor wafers 105 that are processed by the processing tools 610a, 610b can also be sent to a metrology tool 650 for acquisition of metrology data. The metrology tool 650 may be a scatterometry data acquisition tool, an overlay-error measurement tool, a critical dimension measurement tool, and the like. In one embodiment, a metrology tool 650 examines one or more processed semiconductor wafers 105. The metrology data analysis unit 660 may collect, organize, and analyze data from the metrology tool 650. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 610.

The tool state data sensor unit 320 acquires tool sensor data from the processing tools 610a, 610b and provides the data to the tool state variable data analysis unit 330. The modeling engine 350 receives data from the tool state variable data analysis unit 330 and tool state data from the database unit 340 and/or analyzed metrology data from the metrology data analysis unit 660. The tool state variable data analysis unit 330 then determines the effect of a tool model on the processing tools 610a, 610b based upon the tool state data and/or the metrology data that corresponds to particular tool state data. Data from the modeling engine 350 is sent to the computer system 630 which may then implement the operation of the tool model associated with the modeling engine 350.

Figure 7:
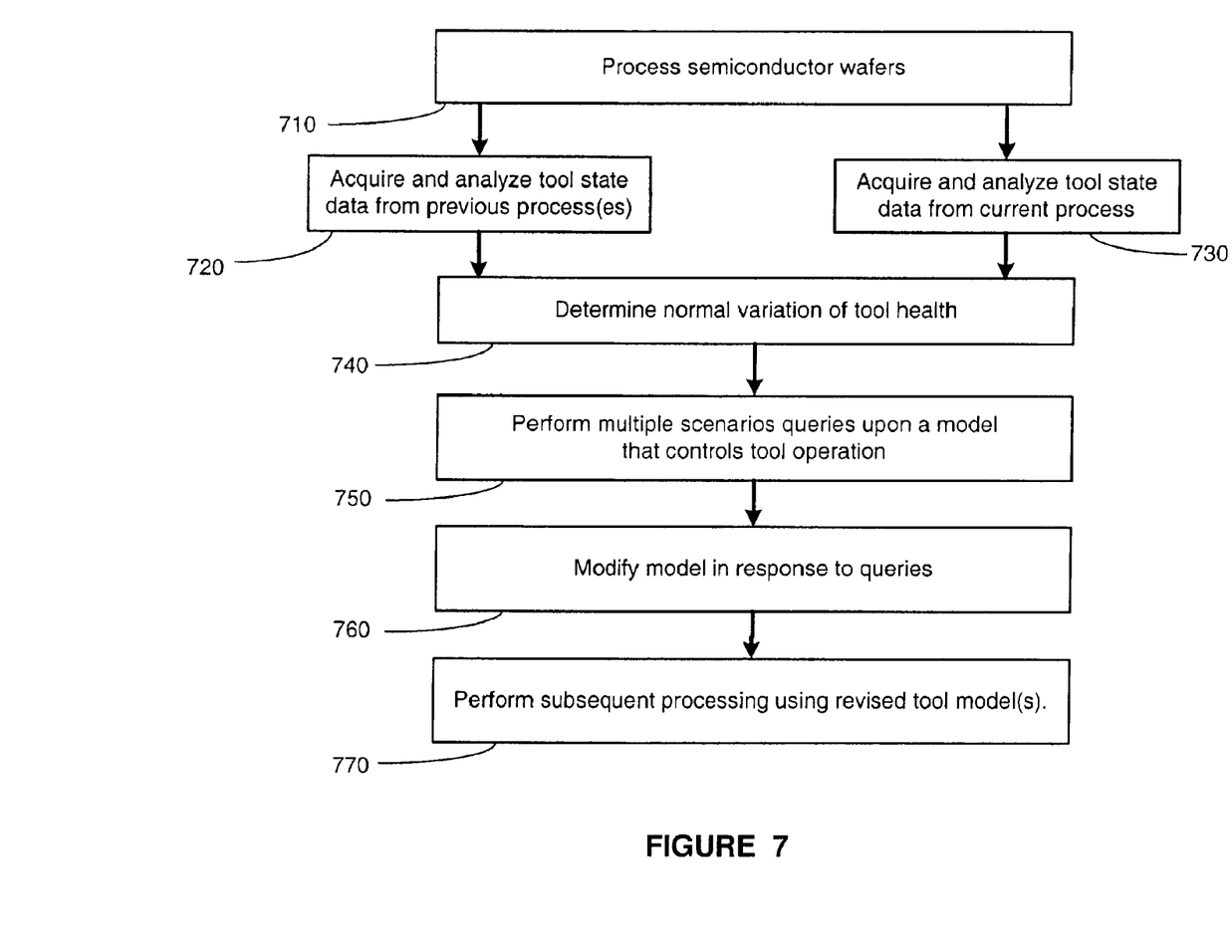
FIG. 7 illustrates a flowchart depiction of a method in accordance with the one illustrative embodiment of the present invention.

Turning now to FIG. 7, a flow chart depiction of a method in accordance with embodiments of the present invention is illustrated. The system 300 processes a batch of semiconductor wafers 105 (block 710). The system 300 acquires and analyzes tool state data relating to the processing tool 610 during the processing of the semiconductor wafers 105 (block 730). Tool state data may be acquired in an inline fashion during the operation of a processing tool 610. The system 300 may also acquire and analyze tool state data from previous processes (block 720). Tool state data relating to the previous processes are generally acquired from the database unit 340. Upon analyzing tool state data, the system 300 is capable of calculating excursions from normal tool health of the processing tool 610. The system 300 calculates a range of normal variations of tool health by analyzing the tool state data (block 740). The determination of the normal variation of the tool health may be performed by the tool state variable data analysis unit 330. In one embodiment, the calculating of the normal variation may comprise comparing the values of the tool data variables to corresponding predetermined values of the tool data variables, which may be determined by those skilled in the art having benefit of the present disclosure.

Figure 8:
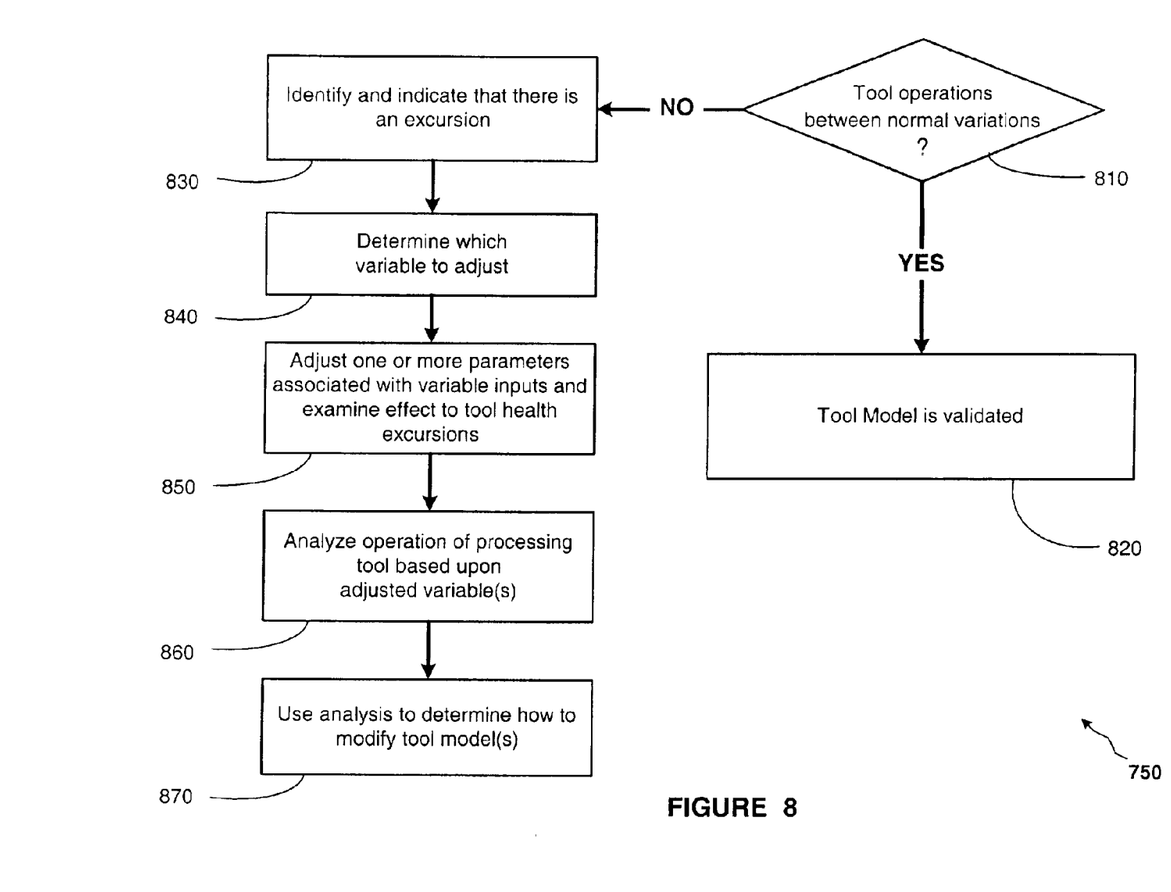
FIG. 8 illustrates a more detailed flowchart depiction of a method of performing multiple scenario queries upon a model, as indicated in FIG. 7, in accordance with one illustrative embodiment of the present invention.

Once the system 300 determines a range of normal variation of the tool health, the system 300 may perform a scenarios query or multiple scenario queries upon the tool model(s) that control the tool operation (block 750). A more detailed description of performing the multiple scenarios query upon the tool model indicated in block 750 is illustrated in FIG. 8 and provided in the accompanying description below. Once a multiple scenarios query is performed on the tool model(s), the tool model(s) may be modified in response to the queries (block 760). The multiple scenarios query may comprise results of a plurality of "what-if" scenarios that include the scenarios for changes in the pressure, temperature, and/or changes in other manufacturing variables and examine how they affect the tool health excursions. If the results indicate that the excursions due to certain query scenarios result in excursions beyond the normal variation of the tool health, then the manufacturing variables are adjusted to conform within limits that result in normal variations of the tool health. For example, the flow rate of the process gas $SiH_4$ is controlled to be within limits that result in a reduction in excursions of the tool health of the processing tool 610.

Furthermore, data relating to a range of manufacturing variables that may be implemented to prevent excursions of the tool health beyond the normal variations is acquired. This data may be calculated by the system 300 based upon the tool state variables, or the data may be received by the computer system 630 from an external source. Additionally, the manufacturing variables may be adjusted such that the tool model(s) may be made more sensitive to particular excursions. For example, the sensitivity of a plasma etch tool qualification, that is, the passing or failing of that tool for the processing of a certain product, may be variable according to the number of cycles that the processing tool 610 was in operation at full voltage bias during a certain time period (e.g., the past 48 hours) leading up to the qualification. Tool state data from previous processes could help model or quantify the sensitivity of the qualification. The system 300 performs a subsequent process operation using the revised tool model(s) (block 770). The subsequent process performed using the revised tool model(s) may result in fewer excursions of the tool health beyond the normal variations.

Turning now to FIG. 8, a more detailed flowchart depiction of the step of performing the multiple scenarios query upon the tool model, as indicated in block 750 of FIG. 7, is illustrated. The system 300 determines if the parameters relating to the tool operation are indeed within normal variation limits (block 810). When the system 300 determines that the tool operation is within the normal variation, the system 300 validates the tool model(s) (block 820). Process operations are then generally continued without significant modification to the tool operation parameters. When the system 300 determines that the tool operation parameters are not within the normal variations, the system 300 identifies the excursion and sets a flag indicating an excursion of the tool health (block 830).

The system 300 may also determine which manufacturing variable may be adjusted to reduce the excursion of the tool health (block 840). The tool state variable data analysis unit 330 may adjust one or more parameters associated with the variable inputs 530, 540, 550 and examine the effect of the tool state variable to the tool health excursions (block 850). The system 300 then analyzes the operation of the processing tool 610 based upon the adjusted variables (block 860). This analysis may comprise simulating the outcome of a processing step performed on the semiconductor wafers 105 based upon the adjustment to one or more tool state variables. Based upon this analysis, the system 300 may determine whether there are unacceptable excursions in the tool health. The system 300 may then use the analysis of the operation of the processing tool 610 to determine how to modify the tool model(s) such that the magnitude of potential excursions of the tool health is reduced (block 870). The completion of the steps illustrated in FIG. 8 substantially completes the steps of performing the multiple scenario queries upon the tool model. Utilizing the steps described above, tool model(s) may be validated and/or excursions of the tool health may be reduced, thereby resulting in more accurate and efficiently processed semiconductor wafers 105.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing a workpiece in a processing tool;
   acquiring tool state data relating to said processing tool, said tool state data comprising a tool state variable;
   determining whether an excursion of the tool health related to the processing tool has occurred based upon said tool state data; and
   modifying said tool state variable to reduce said excursion of the tool health in response to said determination that said excursion of the tool health has occurred.

2. The method of claim 1, wherein processing said workpiece in said processing tool further comprises processing a semiconductor wafer in said processing tool.

3. The method of claim 1, further comprising:
   determining a normal variation of the tool health based upon said tool state data, determining said normal variation comprising analyzing said tool state data and comparing results from said analysis of said tool state data to a predetermined value of said tool state variable;
   adjusting a tool model based upon a determination that said tool health is outside said normal variation.

4. The method of claim 3, wherein determining whether an excursion of the tool health related to the processing tool has occurred further comprises determining whether said tool health has drifted outside said normal variation.

5. The method of claim 4, further comprising validating a tool model in response to a determination that said tool health has drifted outside said normal variation.

6. The method of claim 1, wherein acquiring tool state data relating to said processing tool further comprises acquiring at least one of a pressure data, temperature data, humidity data, and a current data.

7. The method of claim 1, wherein acquiring tool state data relating to said processing tool further comprises acquiring tool state data relating to at least one previous process performed by said processing tool stored in a database.

8. The method of claim 1, wherein modifying said tool state variable to reduce said excursion of the tool health in response to said determination that said excursion of the tool health has occurred further comprises:
   determining a tool state variable to be adjusted in response to a determination that an excursion has occurred;
   analyzing the effect on a process operation performed by said processing tool based upon an adjustment to said tool state variable to be adjusted; and
   modifying a tool model based upon said analysis of the effect on said process operation performed by said processing tool.

9. The method of claim 8, wherein analyzing the effect on a process operation performed by said processing tool based upon an adjustment to said tool state variable to be adjusted further comprises performing a simulation function to simulate the effect of said modification to said tool state variable.

10. The method of claim 1, further comprising performing a multiple scenarios query upon a tool model, said multiple scenarios query comprising:
    determining a plurality of values relating to a plurality of tool state variables to be simulated to determine whether an excursion has occurred;
    analyzing the effect on a simulated process operation performed by said processing tool based upon said plurality of values related to said tool state variables;
    determining that an excursion of said tool health relating to said processing has occurred based upon said analyzing the effect on said simulated process operation; and
    modifying a tool model based upon said analysis of the effect on said simulated process.

11. The method of claim 10, further comprising validating a tool model in response to a determination that an excursion of said tool health has not occurred.

12. A method, comprising:
    processing a semiconductor wafer in a processing tool;
    acquiring inline tool state data relating to said processing tool, said tool stale data comprising a tool stale variable;
    acquiring stored tool state data relating to previous operations performed by said processing tool; and
    performing a scenario query upon a tool model based upon said inline and stored tool state variables, said scenario query comprising determining at least one value relating to a tool state variable to be simulated to determine whether an excursion has occurred and performing a simulation based upon said value relating to said tool state variable.

13. The method of claim 12, wherein performing said scenario query upon a tool model further comprises performing a multiple scenario query, said multiple scenario query comprising determining a plurality of values relating to a plurality of tool state variables to be simulated to determine whether an excursion has occurred and performing a simulation based upon said plurality of values relating to said tool state variables.

14. The method of claim 12, further comprising:
    analyzing the effect on a simulated process operation performed by said processing tool based upon said plurality of values related to said tool state variables;
    determining that an excursion of said tool health relating to said processing has occurred based upon said analyzing the effect on said simulated process operation; and
    modifying a tool model based upon said analysis of the effect on said simulated process.

15. The method of claim 14, wherein determining whether an excursion of the tool health related to the processing tool has occurred further comprises:
    determining a normal variation of the tool health based upon said inline and stored tool state data, determining said normal variation comprising analyzing said inline and stored tool state data and comparing results from an analysis of said inline and stored tool state data to a predetermined value of tool state variables; and
    determining whether said tool health has drifted outside said normal variation.

16. The method of claim 15, further comprising validating a tool model in response to a determination that said tool health has drifted outside said normal variation.

17. An apparatus, comprising:
    means for processing a semiconductor wafer in a processing tool;
    means for acquiring tool state data relating to said processing tool, said tool state data comprising a tool state variable;
    means for determining whether an excursion of the tool health related to the processing tool has occurred based upon said tool state data; and
    means for modifying said tool state variable to reduce said excursion of the tool health in response to said determination that said excursion of the tool health has occurred.

18. A system, comprising:
    a processing tool to process a workpiece; and
    a process controller operatively coupled to said processing tool, said process controller to acquire tool state data relating to said processing tool, determine whether an excursion of the tool health related to the processing tool has occurred based upon said tool state data, modify said tool state variable to reduce said excursion of the tool health in response to said determination that said excursion of the tool health has occurred.

19. The system of claim 18, wherein said workpiece is a semiconductor wafer.

20. The system of claim 18, wherein said process controller being adapted to perform a simulation function using said tool state data to determine whether an excursion of the tool health of said processing tool will occur.

21. The system of claim 18, further comprising:
    a tool state data sensor unit operatively coupled to said process controller and to said processing tool, said tool state data sensor unit to acquire tool state data relating to an operation performed by said processing tool;

a tool state variable data analysis unit coupled to said tool state data sensor unit and to said process controller, said tool state variable data analysis unit to analyze said tool state data to determine whether an excursion of a tool health of said processing tool has occurred; and a modeling engine coupled to said tool state variable data analysis unit and to said process controller, said modeling engine to modify at least one tool model in response to said determination that said excursion of said tool health has occurred.

22. The system of claim 21, further comprising a database unit to store said tool state data.

23. The system of claim 21, wherein said tool state data sensor unit comprises at least one of a pressure sensor, gas flow sensor, temperature sensor, humidity sensor, and a current sensor.

24. An apparatus, comprising:
a process controller adapted to acquire tool state data relating to a processing tool, determine whether an excursion of the tool health related to said processing tool has occurred based upon said tool state data, modify said tool state variable to reduce said excursion of the tool health in response to said determination that said excursion of the tool health has occurred.

25. The apparatus of claim 24, wherein said process controller being adapted to perform a simulation function using said tool state data to determine whether an excursion of the tool health of said processing tool will occur.

26. The apparatus of claims 25, further comprising:
a tool state data sensor unit operatively coupled to said process controller and to said processing tool, said tool state data sensor unit to acquire tool state data relating to an operation performed by said processing tool;

a tool state variable data analysis unit coupled to said tool state data sensor unit and to said process controller, said tool state variable data analysis unit to analyze said tool state data to determine whether an excursion of a tool health of said processing tool has occurred; and a modeling engine coupled to said tool state variable data analysis unit and to said process controller, said modeling engine to modify at least one tool model in response to said determination that said excursion of said tool health has occurred.

27. The apparatus of claim 26, wherein said tool state data sensor unit comprises at least one of a pressure sensor, gas flow sensor, temperature sensor, humidity sensor, and a current sensor.

28. A computer readable program storage device encoded with instructions that, when executed by a computer, performs a method, comprising:
processing a workpiece in a processing tool;
acquiring tool state data relating to said processing tool, said tool state data comprising a tool state variable;
determining whether an excursion of the tool health related to the processing tool has occurred based upon said tool state data; and
modifying said tool state variable to reduce said excursion of the tool health in response to said determination that said excursion of the tool health has occurred.

29. The computer readable program storage device encoded with instructions that, when executed by a computer, performs the method of claim 28, wherein processing said workpiece in said processing tool further comprises processing a semiconductor wafer in said processing tool.

30. The computer readable program storage device encoded with instructions that, when executed by a computer, performs the method of claim 28, further comprising:

determining a normal variation of the tool health based upon said tool state data, determining said normal variation comprising analyzing said tool state data and comparing results from said analysis of said tool state data to a predetermined value of said tool state variable;

adjusting a tool model based upon a determination that said tool health is outside said normal variation.

31. The computer readable program storage device encoded with instructions that, when executed by a computer, performs the method of claim 30, wherein determining whether an excursion of the tool health related to the processing tool has occurred further comprises determining whether said tool health has drifted outside said normal variation.

32. The computer readable program storage device encoded with instructions that, when executed by a computer, performs the method of claim 31, further comprising validating a tool model in response to a determination that said tool health has drifted outside said normal variation.

33. The computer readable program storage device encoded with instructions that, when executed by a computer, performs the method of claim 28, wherein acquiring tool state data relating to said processing tool further comprises acquiring at least one of a pressure data, temperature data, humidity data, and a current data.

34. The computer readable program storage device encoded with instructions that, when executed by a computer, performs the method of claim 28, wherein acquiring tool state data relating to said processing tool further comprises acquiring tool state data relating to at least one previous process performed by said processing tool stored in a database.

35. The computer readable program storage device encoded with instructions that, when executed by a computer, performs the method of claim 28, wherein modifying said tool state variable to reduce said excursion of the tool health in response to said determination that said excursion of the tool health has occurred further comprises:
determining a tool state variable to be adjusted in response to a determination that an excursion has occurred;
analyzing the effect on a process operation performed by said processing tool based upon an adjustment to said tool state variable to be adjusted; and
modifying a tool model based upon said analysis of the effect on said process operation performed by said processing tool.

36. The computer readable program storage device encoded with instructions that, when executed by a computer, performs the method of claim 35, wherein analyzing the effect on a process operation performed by said processing tool based upon an adjustment to said tool state variable to be adjusted further comprises performing a simulation function to simulate an effect of said modification to said tool state variable.

37. The computer readable program storage device encoded with instructions that, when executed by a computer, performs the method of claim 28, further comprising performing a multiple scenarios query upon a tool model, said multiple scenarios query comprising:

determining a plurality of values relating to a plurality of tool state variables to be simulated to determine whether an excursion has occurred;

analyzing the effect on a simulated process operation performed by said processing tool based upon said plurality of values related to said tool state variables;

determining that an excursion of said tool health relating to said processing has occurred based upon said analyzing the effect on said simulated process operation; and modifying a tool model based upon said analysis of the effect on said simulated process.

38. The computer readable program storage device encoded with instructions that, when executed by a computer, performs the method of claim 37, further comprising validating a tool model in response to a determination that an excursion of said tool health has not occurred.

* * * * *

UNITED STATES PATENT AND TRADEMARK OFFICE
CERTIFICATE OF CORRECTION

PATENT NO.    : 6,905,895 B1
DATED         : June 15, 2005
INVENTOR(S)   : Elifido Coss, Jr. and Mark K. Sze-To It is certified that error appears in the above-identified patent and that said Letters Patent is hereby corrected as shown below:

Column 11,
Line 4, change "stale" to -- state -- both occurrences.

Signed and Sealed this

Thirtieth Day of August, 2005

JON W. DUDAS
*Director of the United States Patent and Trademark Office*